United States Patent [19]
Goossen et al.

[11] Patent Number: 5,923,951
[45] Date of Patent: Jul. 13, 1999

[54] METHOD OF MAKING A FLIP-CHIP BONDED GAAS-BASED OPTO-ELECTRONIC DEVICE

[75] Inventors: Keith Wayne Goossen, Aberdeen; Jenn-Ming Kuo, Edison; Yu-Chi Wang, Piscataway, all of N.J.

[73] Assignee: Lucent Technologies Inc., Murray Hill, N.J.

[21] Appl. No.: 08/688,131

[22] Filed: Jul. 29, 1996

[51] Int. Cl.$^6$ ............................................ H01L 21/20
[52] U.S. Cl. .............................. 438/47; 438/29; 438/32
[58] Field of Search .............................. 438/29, 32, 47; 257/777; 372/45, 46, 47

[56] References Cited

U.S. PATENT DOCUMENTS

| | | | |
|---|---|---|---|
| 5,385,632 | 1/1995 | Goossen | 156/630 |
| 5,578,162 | 11/1996 | D'Asaro et al. | 438/118 |

OTHER PUBLICATIONS

"GaAs MQW Moduators Integrated with Silicon CMOS", by K. W. Goossen et al., *IEEE Photonics Technology Letters*, vol. 7, No. 4, Apr. 1995, pp. 360–362.

"GaAS 850 nm Modulators Solder–Bonded to Silicon", by K. W. Goossen et al., *IEEE Photonics Technology Letters*, vol. 5, No. 7, Jul. 1993, pp. 776–778.

Growth of High–quality InGaP and Application for Modulation–doped Structure by Molecular Beam Epitaxy with a GaP Source, by T. Shitara et al., *Journal of Crystal Growth*, vol. 150, No. 1–4, Part 2, pp. 1261–1265 (May 1995).

"Plasma and Wet Chemical Etching of $In_{0.5}Ga_{0.5}P$", by J. R. Lothian et al., *Journal of Electronic Materials*, vol. 21, No. 4, 1992, pp. 441–445.

"High Quality $In_{0.48}Ga_{0.52}P$ Grown by Gas Source Molecular Beam Epitaxy", by J. M. Kuo et al., *J. Vacuum Science and Technology B*, vol. 10(2), Mar./Apr. 1992, pp. 959–961.

"Batch Fabrication and Structure of Integrated GaAs–$Al_xGa_{1-x}$ As Field–Effect Transistor—Self–Electro–optic Effect Devices (FET–SEED's)", by L. A. D'Asaro et al., *IEEE Electron Device Letters*, vol. 13, No. 10, Oct. 1992, pp. 528–531.

"Alignable Epitaxial Liftoff of GaAS Materials with Selective Deposition Using Polyimide Diaphragms", by C. Camperi–Ginestet et al., *IEEE Transactions Photonics Technology Letters*, vol. 3, No. 12, Dec. 1991, pp. 1123–1126.

"Multiple–Quantum–Well Reflection Modulator Using A Lifted–Off GaAs/AlGaAs Film Bonded to Gold on Silicon", by G. W. Yoffe et al., *Electronics Letters*, vol. 27, Mar. 28, 1991, pp. 557–558.

*Primary Examiner*—John F. Niebling
*Assistant Examiner*—Kevin F. Turner
*Attorney, Agent, or Firm*—Eugen E. Pacher

[57] ABSTRACT

In a method of making a flip-chip bonded GaAs-based opto-electronic device, removal of the GaAs substrate is facilitated by provision of a lattice matched $(Al_xGa_{1-x})InP$ etch stop layer, exemplarily a $Ga_{0.51}In_{0.49}P$ layer, and use of an etchant that isotropically etches GaAs such that an essentially mirror-like etch stop layer surface results, and that preferably exhibits an etch rate ratio of at least 200:1 for GaAs and the etch stop layer, respectively. Use of the novel substrate removal method can substantially increase device yield, and facilitate manufacture of large device arrays, e.g., arrays of detector/modulator diodes flip-chip bonded to Si CMOS chips.

6 Claims, 2 Drawing Sheets

METHOD OF MAKING A FLIP-CHIP BONDED GAAS-BASED OPTO-ELECTRONIC DEVICE

FIELD OF THE INVENTION

This invention pertains to methods of making GaAs-based opto-electronic devices, and combinations of arrays of such GaAs-based devices and Si integrated circuits.

BACKGROUND OF THE INVENTION

Flip-chip solder bump bonding of GaAs-based devices onto silicon integrated circuits (ICs) is known. See, for instance, K. W. Goossen et al., *IEEE Photonics Technology Letters*, Vol. 7(4), pp. 360–362, 1995.

If the GaAs-based devices are optoelectronic devices, then it is frequently necessary to remove the GaAs substrate to provide optical access to the devices. This is, for instance, the case in Gs/AlGaAs multi-quantum well (MQW) detector/modulator diode arrays that are flip-chip solder bump bonded onto a silicon CMOS chip. See, for instance, K. W. Goossen et al., *IEEE Photonics Technology Letters*, Vol. 5(7), pp. 776–778, 1994.

The conventional method of making the diode array involves providing a device structure that comprises a thick (e.g., about 1.5 $\mu$m) $Al_{0.3}Ga_{0.7}As$ etch stop layer for GaAs substrate removal. See, for instance, U.S. Pat. No. 5,385,632 to K. W. Goossen. However, the conventional method is not fully satisfactory. Due typically to relatively low etching selectivity between GaAs and $Al_{0.3}Ga_{0.7}As$, the removal of the GaAs substrate by etching frequently is plagued by non-uniformity problems, including missing devices at and near the edges of the arrays. This loss of devices from the edges of arrays is typically not acceptable, and typically requires limitation of the size of the arrays.

A method of making a GaAs/based opto-electronic device (especially arrays of such devices) that can readily facilitate uniform removal of the GaAs substrate would be desirable. This application discloses such a method.

It is known that InGaP can serve as an etch stop layer for GaAs, and some chemical etchants that exhibit selectivity between InGaP and GaAs are known. See, for instance, T. Shitara et al., *Journal of Crystal Growth*, Vol. 150, No. 1-4, Part 2, pp. 1261–1265 (May 1995), and J. R. Lothian et al., *J. of Electronic Materials*, Vol. 21(4), pp. 441–445, 1992. However, conventional usage of InGaP etch stop layers is for removal of relatively thin (typically $\leq 2$ $\mu$m) layers of GaAs, and removal of relatively thick (typically $\geq 100$ $\mu$m) layers of GaAs over InGaP has, to the best of our knowledge, not been suggested previously.

SUMMARY OF THE INVENTION

In a broad aspect the invention is embodied in an improved method of making an article that comprises an opto-electronic device (typically an array of devices) that is flip-chip bonded to a circuitry-bearing Si body, typically a CMOS IC.

More specifically, the method comprises forming a device-bearing substrate by providing a GaAs substrate and forming the device on a first major surface of the GaAs substrate, including forming an etch-stop layer on the first major surface. The method further comprises providing the circuitry-bearing Si body, flip-chip bonding the device-bearing GaAs substrate to the circuitry-bearing Si body, and removing by etching the GaAs substrate, leaving the device operatively connected to the circuitry-bearing Si body.

Significantly, the etch-stop layer is an $(Al_xGa_{1-x})InP$ layer ($0 \leq x < 1$) that is essentially lattice matched to GaAs, and the step of removing the GaAs substrate comprises contacting the GaAs substrate with an etchant selected to substantially isotropicaUy etch GaAs, to provide a substantially mirror-like etch-stop layer surface and to exhibit an etch rate ratio of at least 100:1 (preferably at least 200:1) for the GaAs and the etch stop layer, respectively. Exemplarily the etchant is a $H_3PO_4:H_2O_2:H_2O$ etchant (preferably $5H_3PO_4:3H_2O_2:3H_2O$), or a $NH_4OH:H_2O_2$ etchant (preferably $1NH_4OH:35H_2O_2$). The etch stop layer typically has nominal composition $(Al_xGa_{1-x})_{0.51}In_{0.49}P$, exemplarily $Ga_{0.51}In_{0.49}P$.

DETAILED DESCRIPTION OF AN EXEMPLARY EMBODIMENT

The description below will address a particular exemplary embodiment of the invention, namely, a method of making an array of GaAs-based detector/modulator diodes, flip-chip solder bonded to a Si CMOS chip, and the article produced by the method. Those skilled in the art will undoubtedly appreciate that the invention is not thus limited, and can indeed be embodied in any method that comprises etching of a III/V semiconductor body that comprises GaAs in contact with an AlGaInP etch stop layer, with high discrimination between the two materials.

Figure 1:
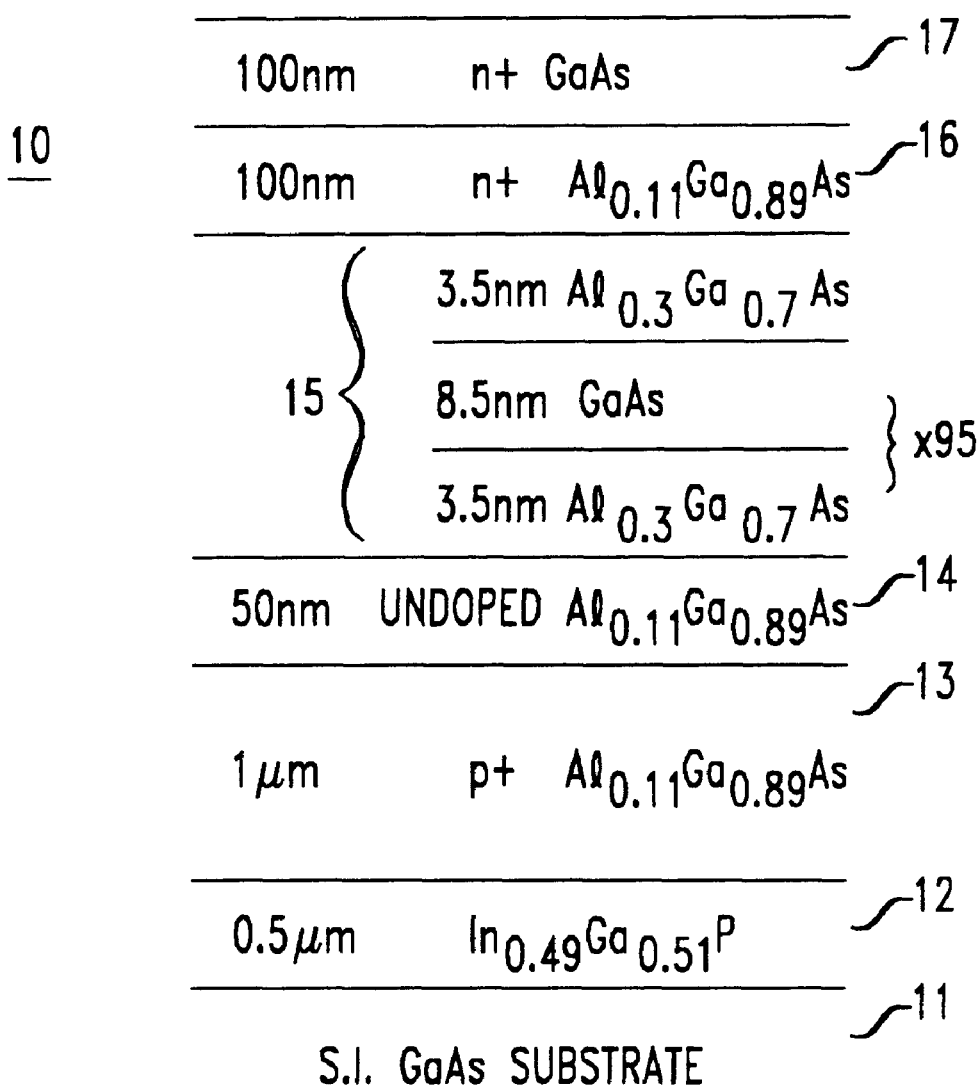
FIG. 1 schematically shows the basic layer structure of an exemplary GaAs-based opto-electronic device, prior to substrate removal.

FIG. 1 schematically depicts the basic layer structure 10 of the exemplary modulator/detector array prior to substrate removal. The layer structure was grown in conventional fashion by gas-source molecular beam epitaxy (GSMBE) on a 2 inch or 3 inch semi-insulating GaAs substrate 11 and consists, in sequence, of a 0.5 $\mu$m $In_{0.49}Ga_{0.51}P$ lattice matched etch-stop layer 12, 1 $\mu$m $p^+$ $Al_{0.11}Ga_{0.89}As$ layer 13, and 50 nm undoped $Al_{0.11}Ga_{0.89}As$ spacer layer 14. The spacer layer is followed by an undoped multiquantum well (MQW) region 15 (95×3.5 nm $Al_{0.3}Ga_{0.7}As$ barriers/8.5 nm GaAs wells), which in turn is followed by a 100 nm $n^+$ $Al_{0.11}Ga_{0.89}As$ layer 16 and a 100 nm $n^+$ GaAs contact layer 17. For further growth details of InGaP on GaAs, see, for instance, J. M. Kuo et al., *J. Vacuum Science and Technology B*, Vol. 10, pp. 959–961 (1992).

After completion of layer structure growth, arrays of detector/modulator diodes were defined in the wafer by a known co-planar ion implantation process. See, for instance, L. A. D'Asaro, *IEEE Electron Device Lett.*, Vol. 13, pp. 528–531 (1992). This was followed by solder deposition on both the n- and p-ohmic contacts of each diode, using photolithography in a batch fabrication process. By way of illustration, each array comprises 4352 detector/modulator diodes, and consequently comprises 8704 solder bumps, and measures 6.2×6.2 mm. After solder bump formation the GaAs-based multilayer wafer was separated into a multiplicity of diode arrays.

Si-CMOS chips (7×7 mm) were made by a conventional 0.8 $\mu$m technology. Each chip had 256 16×1 switching nodes, each with 16 optical inputs and 1 optical output Such chips are known and do not require elaboration. The chips were provided with aluminum pads in the mirror image of the solder bumps of the diode arrays, and Ti-Ni-Au metallization was deposited on the pads to provide a solder-meltable surface. This was followed by solder deposition on the pads by a process similar to the process used for the GaAs-based arrays.

The thus produced Si CMOS chips and GaAs-based diode arrays were flip-chip bonded together in known fashion with a commercially available precision bonder, such that the facing surfaces were about 5 $\mu$m apart. Into this space was flowed a commercially available low viscosity epoxy and cured at 100° C., in order to protect the circuitry from the etchant during the subsequent substrate-removal etch, substantially as described in U.S. patent application Ser. No. 08/366,864 of L. A. D'Asaro et al.

The thus produced flip-chip bonded Si CMOS/GaAs-based diode array combination was then immersed in a stirred room temperature 5:3:3 $H_3PO_4:H_2O_2:H_2O$ solution, which isotropically dissolved the GaAs substrate at a rate of approximately 3.5 $\mu$m/minute. The dissolution essentially stopped at the etch stop layer. The observed etch rate ratio was about 290:1 for GaAs and $In_{0.49}Ga_{0.51}P$, respectively. The etchant was found essentially not to attack Si.

Optionally, a fraction of the substrate thickness can be removed by mechanical polishing, with the remainder of the thickness (e.g., about 150 $\mu$m) removed by chemical etching.

After completion of substrate removal, a $SiO_x$ antireflection (AR) coating typically was deposited on the, now exposed, etch-stop layer, and optical and electrical measurements were carried out on the thus produced device arrays.

Figure 2:
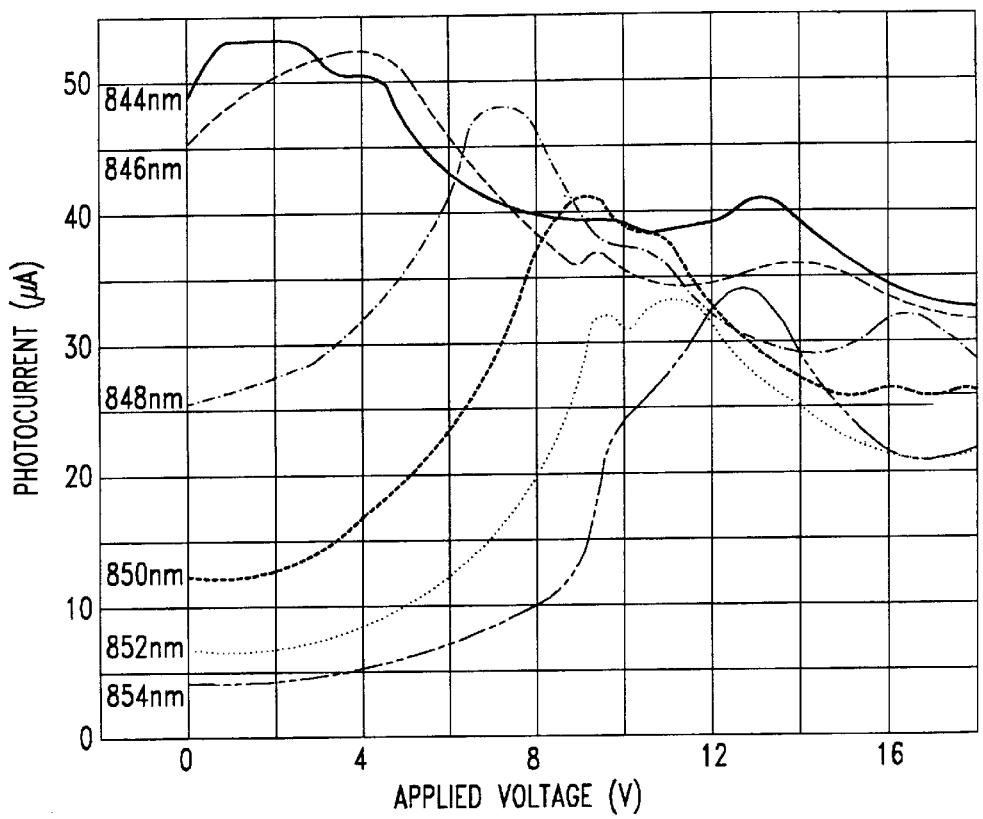
FIG. 2 shows data on photocurrent vs. applied voltage for an exemplary device produced according to the invention.

FIG. 2 shows the photo-current spectra of a modulator without AR coating at several wavelengths under different reverse bias conditions. The peak of the photocurrent shifts to higher bias voltage with increasing wavelength, due to the quantum-confined Stark effect in the GaAs/AlGaAs MQW modulator. At the desired system operation wavelength of 850 nm, a photocurrent change from 12.5 $\mu$A to 42 $\mu$A for a 0 to 8.5 V bias swing was measured. This result is comparable to the best performance observed in an otherwise identical prior art GaAs/AlGaAs MQW modulator grown with an $Al_{0.3}Ga_{0.7}As$ etch-stop layer.

Figure 3:
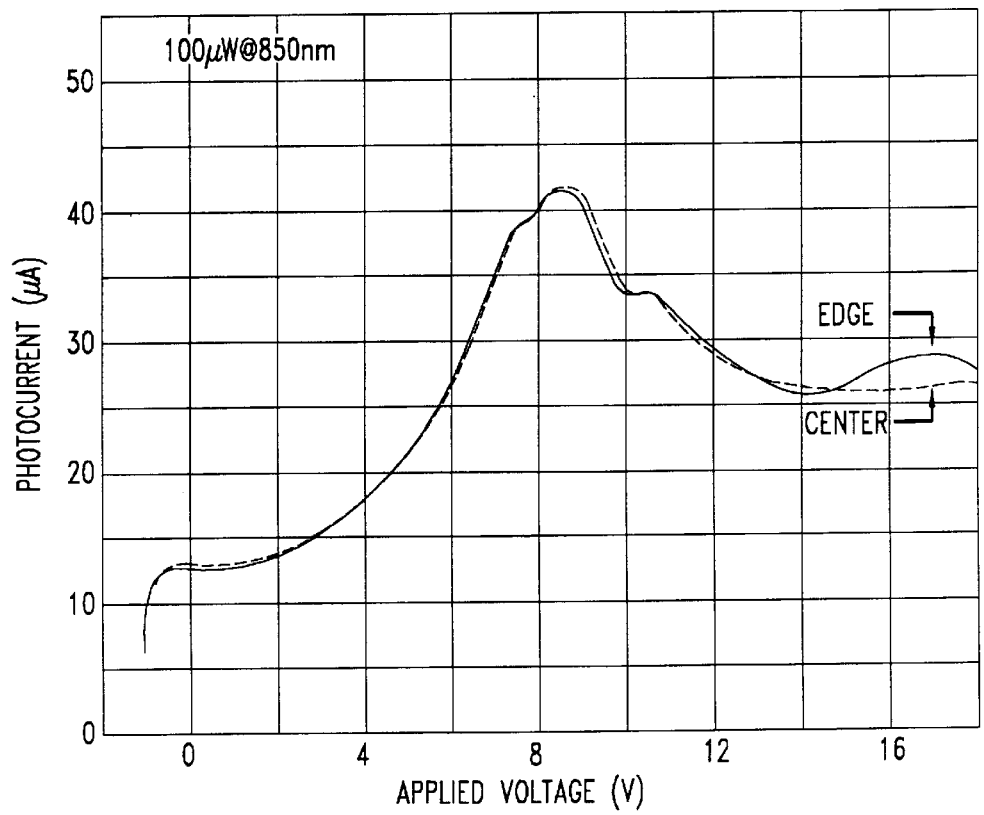
FIG. 3 shows data on photocurrent vs. applied voltage for device located at the center and the edge of the wafer, respectively.

The uniformity of the epitaxial growth and fabrication process (including substrate removal) is demonstrated by the virtual identity of the photocurrents measured from the center to the edge of an exemplary 2 inch wafer, as shown in FIG. 3.

A visual test of several 64×68 arrays (performed by forward biasing the modulators in the light emitting mode) showed essentially 100% yield, with the departure from perfect yield being generally due to missing contacts to the p-type metal, not to any loss of peripheral diodes during substrate removal, as was typically observed in the prior art method of making the flip-chip bonded Si CMOS/GaAs-based detector/modulator diode arrays. Clearly, the inventive method facilitates high yield fabrication of relatively large arrays, making possible devices with high optical signal input/output count, not limited to the 64×68 arrays discussed above. Flip-chip bonded chips substantially as described above can, for instance, be used in a 256×256 asynchronous transfer mode (ATM) switching fabric system operating at 155 Mbit/s data per channel, and such use is contemplated.

An optional, but usually desirable feature of the method of making the flip-chip bonded Si CMOS/GaAs-based diode array is the etching of mesas around the diodes into the GaAs substrate such that, after substrate removal, physically isolated diodes are left See, for instance, the above cited papers by K. W. Goossen et al. The mesa etch can be conventional. The resulting isolated GaAs-based diodes are substantially free of thermally induced stress.

A significant feature of the inventive method is the highly isotropic etching action of the preferred etchants, which facilitates attainment of an essentially mirror-like smooth etch-stop surface after removal of the GaAs substrate. Etching solutions that etch GaAs non-isotropically typically result in a wavy etch-stop surface. Such surfaces typically are not acceptable. For instance, a $5H_3PO_4:2H_2O_2:10H_2O$ etching solution yielded a wavy-finished etch-stop surface, with the surface features preferentially oriented along the (011) crystallographic direction. On the other hand, a $5H_3PO_4:3H_2O_2:3H_2O$ etching solution yielded an essentially mirror-like $In_{0.49}Ga_{0.51}P$ surface over essentially all of a 2 inch wafer.

A further requirement is a substantial difference in etch rate for GaAs and the lattice matched InGaP. Preferably the etch rate ratio is at least 200:1.

The invention is not necessarily embodied in flip-chip bonded combinations, as described above, but can also advantageously be used in the epitaxial lift-off (ELO) technique of combining Si ICs and GaAs-based devices. See, for instance, C. Camperi-Ginestet et al., *IEEE Photonic Technology Letters*, Vol. 3, p. 1123 (1991), and G. W. Yoffe et al., *Electronics Letters*, Vol. 27, p. 557 (1991).

In the ELO technique, the layer structure is deposited on a GaAs substrate, with a sacrificial layer grown between the substrate and the bottom layer of the device. The sacrificial layer is then dissolved by etching, and the epitaxial layer structure is attached to a new (e.g., Si, glass, $LiNbO_3$, polymer) substrate by van der Waals forces. The ELO technique can materially benefit from substitution of a lattice matched InGaP sacrificial layer for the conventionally used AlAs layer. The InGaP layer is selectively etched away in a, e.g., HCl-based solution and the epitaxial layer structure thereby separated from the GaAs substrate.

The invention claimed is:

1. Method of making an article that comprises an opto-electronic device flip-chip bonded to a circuitry-bearing Si body, the method comprising
   a) forming a device-bearing substrate by providing a GaAs substrate and forming the opto-electronic device on a first major surface of the GaAs substrate, including forming an etch-stop layer on the first major surface;
   b) providing the circuitry-bearing Si body;
   c) flip-chip bonding the device-bearing GaAs substrate to the circuitry-bearing Si body;
   d) removing by etching the GaAs substrate, leaving the opto-electronic device operatively connected to the circuitry-bearing Si body;
   CHARACTERIZED IN THAT
   e) the etch-stop layer is an AlGaInP-layer essentially lattice matched to GaAs;
   f) step d) comprises contacting the GaAs substrate with an etchant selected to etch GaAs essentially isotropically to produce a substantially mirror-like etch-stop layer surface, and to exhibit an etch rate ratio of at least 100:1 for GaAs and the etch stop layer, respectively.

2. Method according to claim 1, wherein the etch stop layer has nominal composition $(Al_xGa_{1-x})_{0.51}In_{0.49}P$, $0 \leq x < 1$, and the etchant is selected from the group consisting of $NH_4OH:H_2O_2$ etchants and $H_3PO_4:H_2O_2:H_2O$ etchants.

3. Method according to claim 2, wherein the etch stop layer has nominal composition $Ga_{0.51}In_{0.49}P$, and the etchant is selected from the group consisting of $5H_3PO_4:3H_2O_2:3H_2O$ and $1NH_4OH:35H_2O_2$.

4. Method according to claim 1, wherein an array of detector/modulator diodes is flip-chip bonded to a Si CMOS chip.

5. Method according to claim 1, wherein step d) comprises thinning the substrate by mechanical polishing prior to contacting the thinned GaAs substrate with the etchant.

6. Method according to claim 5, wherein the thinned GaAs substrate has a thickness of at least 100 μm.

* * * * *